United States Patent
Drexler (10) Patent No.: US 6,906,566 B2
(45) Date of Patent: Jun. 14, 2005

(54) DUAL-PHASE DELAY-LOCKED LOOP CIRCUIT AND METHOD

(75) Inventor: Adrian J. Drexler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/269,398

(22) Filed: Oct. 10, 2002

(65) Prior Publication Data

US 2003/0067015 A1 Apr. 10, 2003

Related U.S. Application Data

(62) Division of application No. 09/974,386, filed on Oct. 9, 2001.

(51) Int. Cl.[7] .................................................. H03L 7/06
(52) U.S. Cl. ....................................... 327/158; 327/161
(58) Field of Search ................................ 327/158, 161, 327/163, 156, 270, 271, 149, 150, 153, 159; 365/194, 233; 713/400, 401, 500

(56) References Cited

U.S. PATENT DOCUMENTS

| 4,965,810 A | 10/1990 | Peischl et al. ............... 375/80 |
| 5,036,528 A | 7/1991 | Costantino et al. .......... 375/119 |
| 5,077,686 A | 12/1991 | Rubinstein ................... 395/550 |
| 5,233,316 A | 8/1993 | Yamada et al. ............... 331/45 |
| 5,525,939 A | 6/1996 | Yamauchi et al. ............ 331/57 |
| 5,574,508 A | 11/1996 | Diamant ...................... 348/511 |
| 5,614,845 A | * 3/1997 | Masleid ........................ 326/93 |
| 5,675,273 A | * 10/1997 | Masleid ....................... 327/156 |
| 5,757,218 A | 5/1998 | Blum ........................... 327/175 |
| 5,910,740 A | 6/1999 | Underwood ................. 327/149 |
| 5,923,715 A | 7/1999 | Ono ............................. 375/376 |
| 5,946,244 A | 8/1999 | Manning .................... 365/194 |
| 5,955,905 A | 9/1999 | Idei et al. .................... 327/160 |

(Continued)

OTHER PUBLICATIONS

Chae, Jeong–Seok et al., "Wide Range Single–Way–Pumping Synchronous Mirror Delay", IEEE Electronics Letter Online No. 20000711, Feb. 11, 2000, pp. 939–940.

Jang, Seong–Jin et al., A Compact Ring Delay Line for High Speed Synchronous DRAM, IEEE Symposium on VLSI Circuits Digest of Technical Papers, 1998, pp. 60–61.

(Continued)

*Primary Examiner*—Linh My Nguyen
(74) *Attorney, Agent, or Firm*—Dorsey & Whtiney LLP (57) ABSTRACT

A delay-locked loop includes a clock multiplier that generates a multiplied clock signal responsive to an input clock signal. The multiplied clock signal has a frequency that is a multiple of a frequency of the input clock signal. A variable delay circuit generates a delayed clock signal responsive to the multiplied clock signal, the delayed clock signal having a delay relative to the multiplied clock signal. The variable delay circuit controls the value of the delay responsive to a delay control signal. A comparison circuit generates the delay control signal in response to the relative phases of the delayed clock signal and the multiplied clock signal. In another embodiment, the delay-locked loop omits the clock multiplier and instead includes a comparison circuit that generates the delay control signal in response to the relative phases of both the rising- and falling-edge transitions of the delayed and input clock signals.

18 Claims, 9 Drawing Sheets

U.S. PATENT DOCUMENTS

| | | | |
|---|---|---|---|
| 5,956,289 A | 9/1999 | Norman et al. | 365/233 |
| 5,969,552 A | 10/1999 | Lee et al. | 327/158 |
| 6,067,648 A | 5/2000 | Hunter et al. | 714/718 |
| 6,069,508 A | 5/2000 | Takai | 327/161 |
| 6,087,868 A * | 7/2000 | Millar | 327/156 |
| 6,107,891 A | 8/2000 | Coy | 331/18 |
| 6,150,856 A | 11/2000 | Morzano | 327/149 |
| 6,150,892 A | 11/2000 | Lee et al. | 331/46 |
| 6,160,755 A | 12/2000 | Norman et al. | 365/233 |
| 6,194,932 B1 * | 2/2001 | Takemae et al. | 327/158 |
| 6,239,641 B1 | 5/2001 | Lee | 327/270 |
| 6,240,042 B1 | 5/2001 | Li | 365/233 |
| 6,304,117 B1 | 10/2001 | Yamazaki et al. | 327/158 |
| 6,310,822 B1 | 10/2001 | Shen | 365/233 |
| 6,323,705 B1 * | 11/2001 | Shieh et al. | 327/158 |
| 6,330,197 B1 | 12/2001 | Currin et al. | 365/194 |
| 6,340,904 B1 | 1/2002 | Manning | 327/156 |
| 6,373,307 B1 | 4/2002 | Takai | 327/161 |
| 6,378,079 B1 * | 4/2002 | Mullarkey | 713/401 |
| 6,380,811 B1 | 4/2002 | Zarubinsky et al. | 331/18 |
| 6,404,248 B1 | 6/2002 | Yoneda | 327/158 |
| 6,417,715 B2 * | 7/2002 | Hamamoto et al. | 327/291 |
| 6,426,900 B1 * | 7/2002 | Maruyama et al. | 365/194 |
| 6,445,231 B1 | 9/2002 | Baker et al. | 327/158 |
| 6,476,653 B1 | 11/2002 | Matsuzaki | 327/158 |
| 6,480,047 B2 | 11/2002 | Abdel-Maguid et al. | 327/161 |
| 6,484,268 B2 | 11/2002 | Tamura et al. | 713/600 |
| 6,490,207 B2 | 12/2002 | Manning | 365/194 |
| 6,509,776 B2 | 1/2003 | Kobayashi et al. | 327/277 |
| 6,556,489 B2 * | 4/2003 | Gomm et al. | 365/194 |
| 6,605,969 B2 | 8/2003 | Mikhalev et al. | 327/158 |
| 6,625,765 B1 | 9/2003 | Krishnan | 714/718 |
| 6,693,472 B2 | 2/2004 | Mikhalev et al. | 327/149 |
| RE38,482 E | 3/2004 | Leung et al. | 375/357 |
| 6,759,911 B2 | 7/2004 | Gomm et al. | 331/10 |
| 2002/0167346 A1 | 11/2002 | Yoon et al. | 327/158 |
| 2002/0176315 A1 | 11/2002 | Graaff | 365/233 |
| 2002/0180499 A1 | 12/2002 | Kim et al. | 327/158 |

OTHER PUBLICATIONS

Kuge, Shigehiro et al., "A 0.18 $\mu$m 256Mb DDR–SDRAM with Low–Cost Post–Mold–Tuning Method for DLL Replica", IEEE International Solid–State Circuits Conference, Feb. 2000, pp. 402–403.

Saeki, Takanori et al., "A 2.5ns Clock Access 250MHz 256Mb SDRAM with a Synchronous Mirror Delay", IEEE International Solid–State Circuits Conference, Feb. 1996, pp. 374–375.

Takai, Yasuhiro et al., A 250Mb/s/pin 1Gb Double Data Rate SDRAM with a Bi–Directional Delay and an Inter–Bank Shared Redundancy Scheme, 1999.

Kuge, Shigehiro et al., "A 0.18–$\mu$m 256–Mb DDR–SDRAM with Low–Cost Post–Mold Tuning Method for DLL Replica", IEEE Journal of Solid–State Circuits, vol. 35, No. 11, Nov. 2000, pp. 1680–1689.

* cited by examiner

DUAL-PHASE DELAY-LOCKED LOOP CIRCUIT AND METHOD

CROSS-REFERENCE TO RELATED APPLICATION

This application is a divisional of pending U.S. patent application Ser. No. 09/974,386, filed Oct. 9, 2001.

TECHNICAL FIELD

The present invention relates generally to integrated circuits, and more specifically to synchronizing an external clock signal applied to an integrated circuit with internal clock signals generated in the integrated circuit in response to the external clock signal.

BACKGROUND OF THE INVENTION

In synchronous integrated circuits, the integrated circuit is clocked by an external clock signal and performs operations at predetermined times relative the rising and falling edges of the applied clock signal. Examples of synchronous integrated circuits include synchronous memory devices such as synchronous dynamic random access memories (SDRAMs), synchronous static random access memories (SSRAMs), and packetized memories like SLDRAMs and RDRAMs, and include other types of integrated circuits as well, such as microprocessors. The timing of signals external to a synchronous memory device is determined by the external clock signal, and operations within the memory device typically must be synchronized to external operations. For example, commands are placed on a command bus of the memory device in synchronism with the external clock signal, and the memory device must latch these commands at the proper times to successfully capture the commands. To latch the applied commands, an internal clock signal is developed in response to the external clock signal, and is typically applied to latches contained in the memory device to thereby clock the commands into the latches. The internal clock signal and external clock must be synchronized to ensure the internal clock signal clocks the latches at the proper times to successfully capture the commands. In the present description, "external" is used to refer to signals and operations outside of the memory device, and "internal" to refer to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. To increase the rate at which commands can be applied and at which data can be transferred to and from the memory device, the frequency of the external clock signal is increased, and in modern synchronous memories the frequency is in excess of 100 MHZ. As the frequency of the external clock signal increases, however, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result, the commands applied to the memory device may no longer be valid by the time the internal clock signal clocks the latches.

Figure 1:
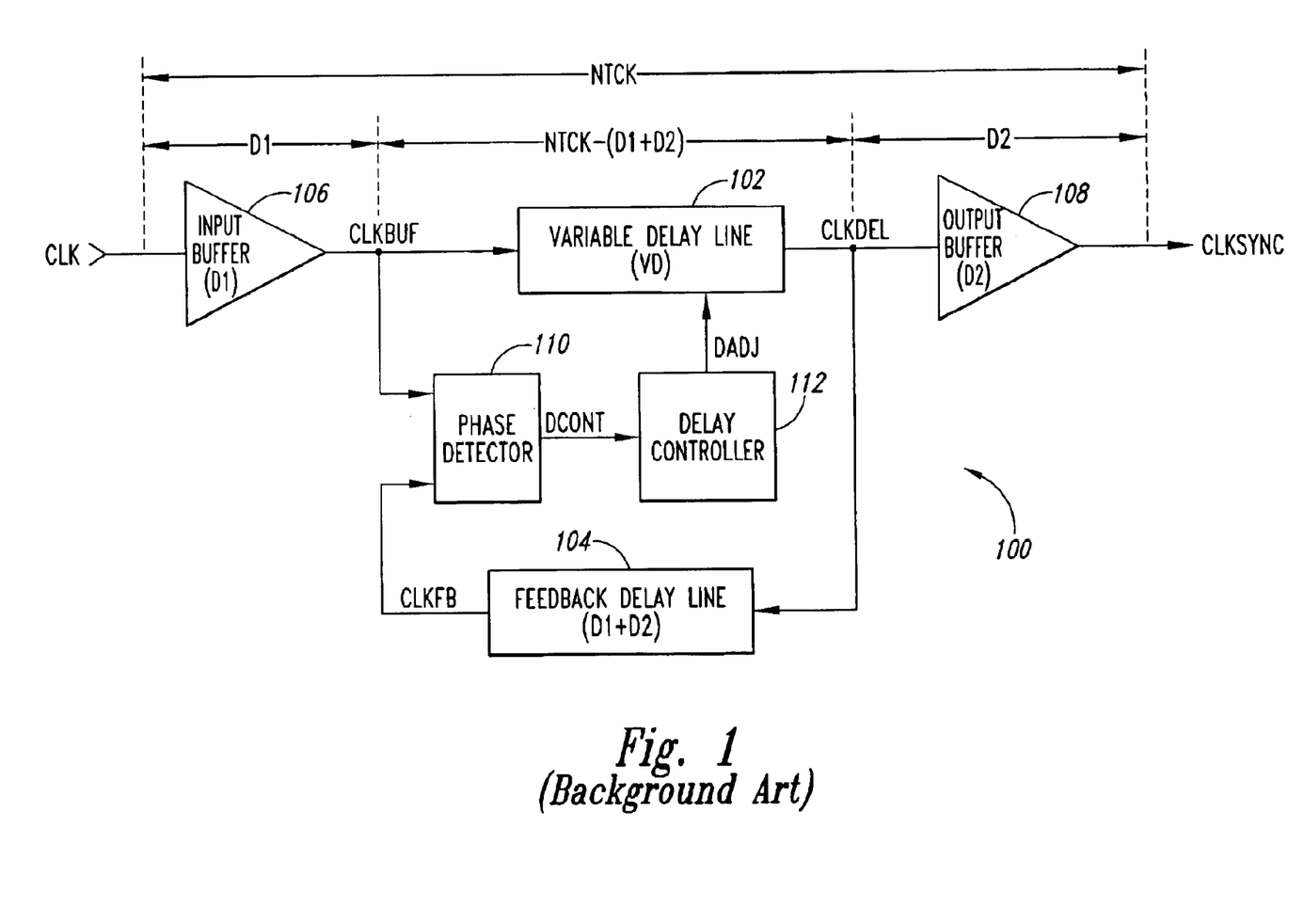
FIG. 1 is a functional block diagram of a conventional delay-locked loop.

To synchronize external and internal clock signals in modern synchronous memory devices, a number of different approaches have been considered and utilized, including delay-locked loops (DLLs), phased-locked loops (PLLs), and synchronous mirror delays (SMDs), as will be appreciated by those skilled in the art. As used herein, the term synchronized includes signals that are coincident and signals that have a desired delay relative to one another. FIG. 1 is a functional block diagram illustrating a conventional delay-locked loop 100 including a variable delay line 102 that receives a clock buffer signal CLKBUF and generates a delayed clock signal CLKDEL in response to the clock buffer signal. The variable delay line 102 controls a variable delay VD of the CLKDEL signal relative to the CLKBUF signal in response to a delay adjustment signal DADJ. A feedback delay line 104 generates a feedback clock signal CLKFB in response to the CLKDEL signal, the feedback clock signal having a model delay D1+D2 relative to the CLKDEL signal. The D1 component of the model delay D1+D2 corresponds to a delay introduced by an input buffer 106 that generates the CLKBUF signal in response to an external clock signal CLK, while the D2 component of the model delay corresponds to a delay introduced by an output buffer 108 that generates a synchronized clock signal CLKSYNC in response to the CLKDEL signal. Although the input buffer 106 and output buffer 108 are illustrated as single components, each represents all components and the associated delay between the input and output of the delay-locked loop 100. The input buffer 106 thus represents the delay D1 of all components between an input that receives the CLK signal and the input to the variable delay line 102, and the output buffer 108 represents the delay D2 of all components between the output of the variable delay line and an output at which the CLKSYNC signal is developed.

The delay-locked loop 100 further includes a phase detector 110 that receives the CLKFB and CLKBUF signals and generates a delay control signal DCONT having a value indicating the phase difference between the CLKBUF and CLKFB signals. One implementation of a phase detector is described in U.S. Pat. No. 5,946,244 to Manning (Manning), which is assigned to the assignee of the present patent application and which is incorporated herein by reference. A delay controller 112 generates the DADJ signal in response to the DCONT signal from the phase detector 110, and applies the DADJ signal to the variable delay line 102 to adjust the variable delay VD. The phase detector 110 and delay controller 112 operate in combination to adjust the variable delay VD of the variable delay line 102 as a function of the detected phase between the CLKBUF and CLKFB signals.

In operation, the phase detector 110 detects the phase difference between the CLKBUF and CLKFB signals, and the phase detector and delay controller 112 operate in combination to adjust the variable delay VD of the CLKDEL signal until the phase difference between the CLKBUF and CLKFB signals is approximately zero. More specifically, as the variable delay VD of the CLKDEL signal is adjusted the phase of the CLKFB signal from the feedback delay line 104 is adjusted accordingly until the CLKFB signal has approximately the same phase as the CLKBUF signal. When the delay-locked loop 100 has adjusted the variable delay VD to a value causing the phase shift between the CLKBUF and CLKFB signals to equal approximately zero, the delay-locked loop is said to be "locked." When the delay-locked loop 100 is locked, the CLK and CLKSYNC signals are synchronized. This is true because when the phase shift between the CLKBUF and CLKFB signals is approximately zero (i.e., the delay-locked loop 100 is locked), the variable delay VD has a value of NTCK−(D1+D2) as indicated in FIG. 1, where N is an integer and TCK is the period of the CLK signal. When VD equals NTCK−(D1+D2), the total delay of the CLK signal through the input buffer 106, variable delay line 102, and output buffer 108 is D1+NTCK−(D1+D2)+D2, which equals NTCK. Thus, the CLKSYNC signal is delayed by NTCK relative to the CLK signal and the two signals are synchronized since the delay is an integer multiple of the period of the CLK signal. Referring back to the discussion of synchronous memory devices above, the CLK signal corresponds to the external clock signal and the CLKSYNC signal corresponds to the internal clock signal.

Figure 2:
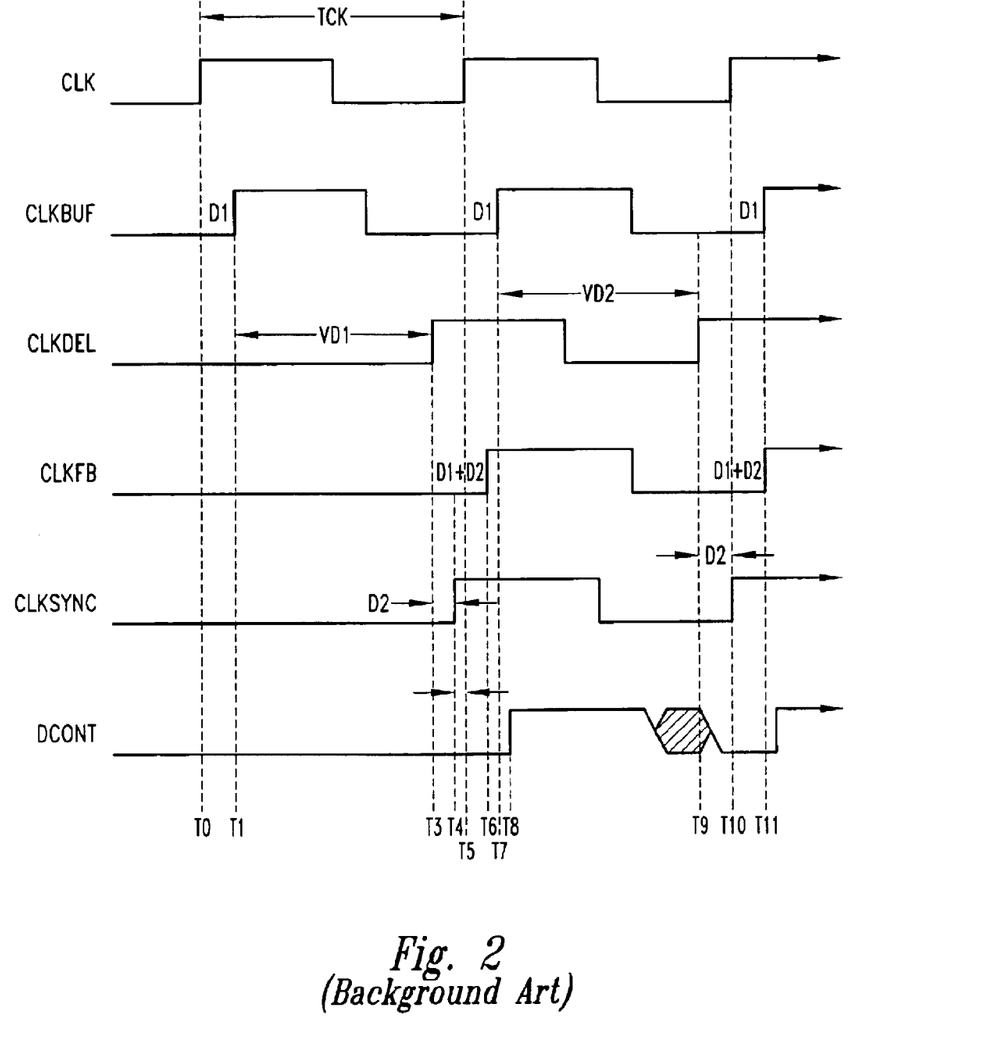
FIG. 2 is a signal timing diagram illustrating various signals generated during operation of the delay-locked loop of FIG. 1.

FIG. 2 is a signal timing diagram illustrating various signals generated during operation of the delay-locked loop 100 of FIG. 1. In response to a rising-edge of the CLK signal at a time T0, the CLKBUF signal goes high the delay D1 later at a time T1. Initially, the variable delay VD as a value VD1, causing the CLKDEL signal to go high at a time T3 and the CLKSYNC signal to go high at a time T4. At this point, note that the positive-edge of the CLKSYNC signal at the time T4 is not synchronized with the CLK signal, which transitions high at a time T5. In response to the rising-edge of the CLKDEL signal at the time T3, the CLKFB goes high at a time T6, which occurs before a positive-edge of the CLKBUF signal occurring at a time T7. Thus, the positive-edge of the CLKFB signal occurs at the time T6 while the positive-edge of the CLKBUF occurs at the time T7, indicating there is a phase shift between the two signals. The phase detector 110 (FIG. 1) detects this phase difference, and generates the DCONT signal just after the time T7 at a time T8 which, in turn, causes the delay controller 112 (FIG. 1) to generate the DADJ signal to adjust the value of the variable delay VD to a new value VD2.

In response to the new variable delay VD2, the next rising-edge of the CLKDEL signal occurs at a time T9. The CLKSYNC signal transitions high the delay D2 later at a time T10 and in synchronism with a rising-edge of the CLK signal. At this point, the delay-locked loop 100 is locked. In response to the positive-edge transition of the CLKDEL signal at the time T9, the CLKFB signal transitions high at a time T11 in synchronism with the CLKBUF signal. Once again, the phase detector 110 (FIG. 1) detects the phase difference between the CLKBUF and CLKFB signals, which in this case is approximately zero, and generates the DCONT signal just after the time T11 in response to the detected phase difference. In this situation, the generated DCONT signal would not cause the variable delay VD2 to be adjusted since the delay-locked loop 100 is locked. Moreover, although the relative phases of the CLKBUF and CLKFB signals is detected in response to each rising-edge of these signals, the variable delay VD may not be adjusted immediately even where such a phase difference is detected. For example, the variable delay VD may be adjusted only when a phase difference between the CLKFB and CLKBUF signals exists for a predetermined time or exceeds a predetermined magnitude. In this way, the phase detector 110 and delay controller 112 can provide a sort of "filtering" of jitter or variations in the CLK signal, as will be understood in the art.

In the delay-locked loop 100, each cycle of the CLK signal the phase detector 110 compares rising-edges of the CLKBUF and CLKFB signals and generates the appropriate DCONT signal to incrementally adjust the variable delay VD until the delay-locked loop 100 is locked. The phase detector 110 could also compare falling-edges of the CLK- BUF and CLKFB signals, as in the previously mentioned Manning patent. In this way, the delay-locked loop 100 incrementally adjusts the variable delay VD once each cycle of the CLK signal. Although the example of FIG. 2 illustrates the delay-locked loop 100 as locking and therefore synchronizing the CLK and CLKSYNC signals after only two cycles of the CLK signal, the delay-locked loop typically takes as many as 200 cycles of the CLK signal to lock. Before the delay-locked loop 100 is locked, the CLKSYNC signal cannot be used to latch signals being applied to the synchronous memory device containing the delay-locked loop. As a result, the time it takes to lock the delay-locked loop 100 may slow the operation of the associated synchronous memory device. For example, in a conventional double data rate (DDR) SDRAM, the delay-locked loop is automatically disabled when the SDRAM enters a self-refresh mode of operation. Upon exiting the self-refresh mode, 200 cycles of the applied CLK signal must then occur before read or write data transfer commands can be applied to the SDRAM.

In the delay-locked loop 100, the variable delay line 102 typically is formed from a number of serially-connected individual delay stages, with individual delay stages being added or removed to adjust the variable delay VD, as will be understood by those skilled in the art. For example, a plurality of serially-connected inverters could be used to form the variable delay line 102, with the output from different inverters being selected in response to the DADJ to control the variable delay VD. A large number of stages in the variable delay line 102 is desirable with each stage having an incremental delay to provide better resolution in controlling the value of the variable delay VD. In addition, the variable delay line 102 must be able to provide the maximum variable delay VD corresponding to the CLK signal having the lowest frequency in the frequency range over which the delay-locked loop is designed to operate. This is true because the variable delay line 102 must provide a variable delay VD of NTCK−(D1+D2), which will have its largest value when the period of the CLK signal is greatest, which occurs at the lowest frequency of the CLK signal. The desired fine resolution and maximum variable delay VD that the variable delay line 102 must provide can result in the delay line consisting of a large number of individual delay stages that consume a relatively large amount of space on a semiconductor substrate in which the delay-locked loop 100 and other components of the synchronous memory device are formed. Moreover, such a large number of individual delay stages can result in significant power consumption by the delay-locked loop 100, which may be undesirable particularly in applications where synchronous memory device is contained in a portable battery-powered device.

There is a need for a delay-locked loop that occupies less space on a semiconductor substrate, consumes less power, and more quickly locks on an applied clock signal.

SUMMARY OF THE INVENTION

According to one aspect of the present invention, a delay-locked loop, includes a clock multiplier that generates a multiplied clock signal responsive to an input clock signal. The multiplied clock signal has a frequency that is a multiple of a frequency of the input clock signal. A variable delay circuit is coupled to the clock multiplier and generates a delayed clock signal responsive to the multiplied clock signal. The delayed clock signal has a delay relative to the multiplied clock signal and the variable delay circuit controls the value of the delay responsive to a delay control signal. A comparison circuit is coupled to the clock multiplier and to the variable delay circuit to generate the delay control signal in response to the relative phases of the delayed clock signal and the multiplied clock signal.

According to another aspect of the present invention, a delay-locked loop includes a variable delay circuit that receives an input clock signal and generates a delayed clock signal responsive to the input clock signal. The delayed clock signal has a delay relative to the input clock signal and the variable delay circuit controls the value of the delay responsive to a delay control signal. A comparison circuit is coupled to the variable delay circuit and generates the delay control signal in response to the relative phases of the rising-edge transitions of the delayed and input clock signals and in response to the relative phases of the falling-edge transitions of the delayed and input clock signals.

DETAILED DESCRIPTION OF THE INVENTION

Figure 3:
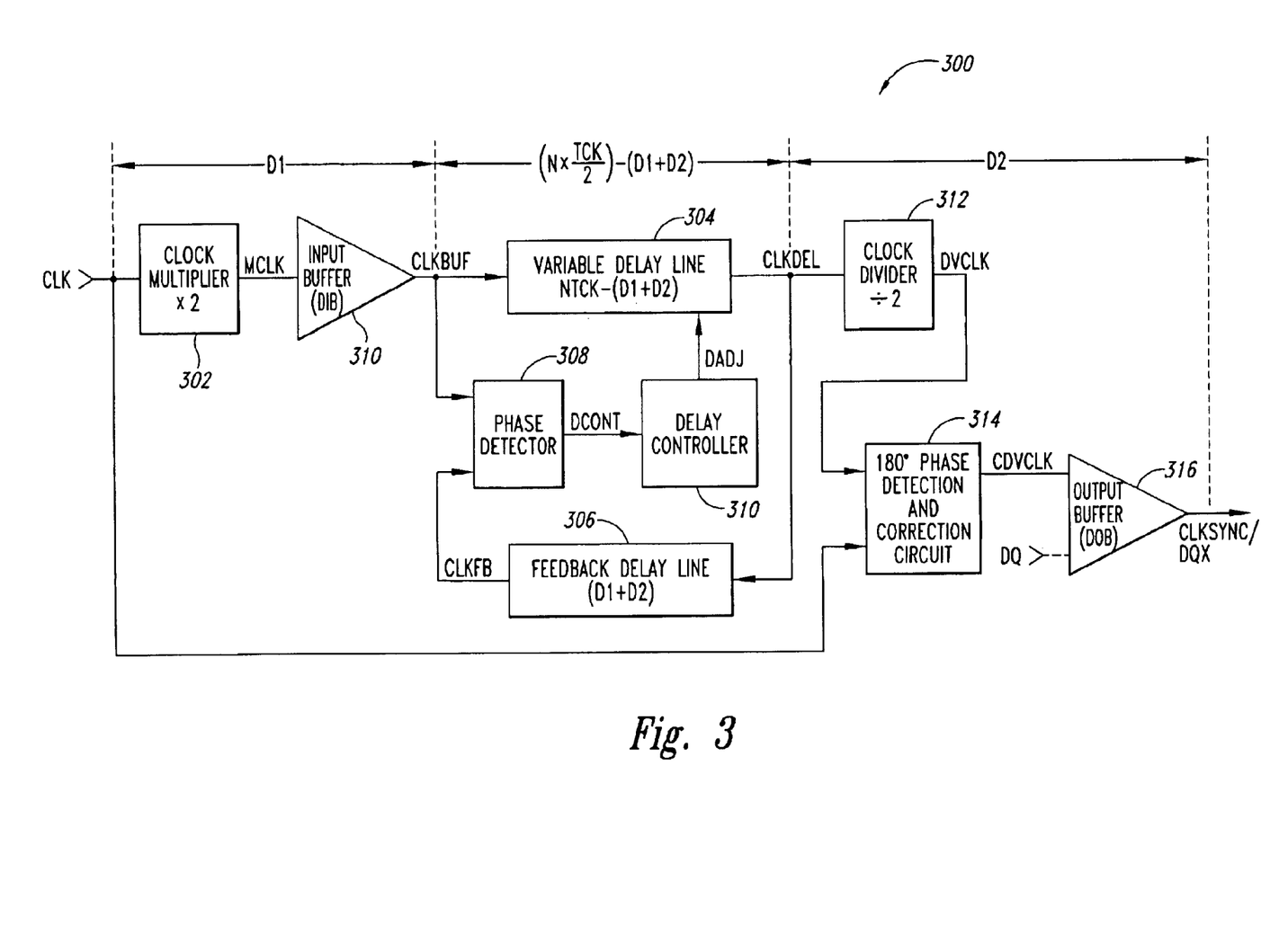
FIG. 3 is a functional block diagram of a delay-locked loop according to one embodiment of the present invention.

FIG. 3 is a functional block diagram of a delay-locked loop 300 including a clock multiplier 302 that multiplies a frequency of an applied external clock signal CLK, allowing a variable delay VD of a delayed clock signal CLKDEL to be adjusted multiple times during each cycle of the applied clock signal and thereby enabling the applied clock signal to be more quickly locked, as will be explained in more detail below. In addition to locking more quickly on the CLK signal, the delay-locked loop 300 also enables a smaller variable delay line 304 to be utilized over a given operating frequency range due to the increased frequency of the signal being locked, as will also be explained below in more detail. In the following description, certain details are set forth to provide a sufficient understanding of the invention. It will be clear to one skilled in the art, however, that the invention may be practiced without these particular details. In other instances, well-known circuits, control signals, timing protocols, and software operations have not been shown in detail or omitted entirely in order to avoid unnecessarily obscuring the invention.

The delay-locked loop 300 includes the variable delay line 304, a feedback delay line 306, a phase detector 308, and a delay controller 310, all of which operate individually and in combination as previously described for the corresponding components in the conventional delay-locked loop 100 of FIG. 1. Thus, for the sake of brevity, the operation of these components will not again be described in detail. In the delay-locked loop 300, the clock multiplier 302 generates a multiplied clock signal MCLK in response to the CLK signal. The MCLK signal has a frequency FMCLK equal to a frequency FCLK of the CLK signal times 2^N, where N is an integer (i.e., FMCLK=FCLK×2^N). In the embodiment of FIG. 3, N=1 so that the frequency FMCLK of the MCLK signal is twice the frequency FCLK of the CLK signal.

An input buffer 310 develops a clock buffer signal CLK-BUF in response to the MCLK signal. The input buffer 310 introduces an input buffer delay DIB, causing the CLKBUF signal to be delayed by the input buffer delay relative to the MCLK signal. The clock multiplier 302 also introduces a delay to the MCLK signal relative to the CLK signal. The delay introduced by the clock multiplier 302 plus the input buffer delay DIB introduced by the input buffer 310 together form the model delay component D1 in the feedback delay line 306. Although the clock multiplier 302 is shown connected before the input buffer 310 in the embodiment of FIG. 3, one skilled in the art will realize the input buffer and clock multiplier would typically be reversed, with the input buffer receiving the CLK signal and supplying the CLKBUF signal to the clock multiplier which, in turn, applies the MCLK signal to the variable delay line 304.

In the delay-locked loop 300, a clock divider 312 receives the CLKDEL signal and generates a divided clock signal DVCLK having the frequency FCLK of the CLKDEL signal. Thus, in the embodiment of FIG. 3, the clock divider 312 divides the multiplied frequency FMCLK of the MCLK signal by two to generate the DVCLK signal having the same frequency as the CLK. The clock divider 312 could also divide the frequency of the CLKDEL signal by other factors to generate the DVCLK signal having a frequency that is equal to the FMCLK signal divided by 2^N. A phase detection and correction circuit 314 receives the DVCLK and CLK signals, detects whether these two signals are approximately 180 degrees out of phase, and generates a corrected divided clock signal CDVCLK in response to the detected phase. More specifically, when the phase detection and correction circuit 314 determines the DVCLK and CLK signals are not approximately 180 degrees out of phase, the circuit outputs the DVCLK as the CDVCLK signal. In contrast, when the phase detection and correction circuit 314 detects the phase between the DVCLK and CLK signals is approximately 180 degrees, the phase detection and correction circuit inverts the DVCLK signal to generate the CDVCLK signal. The phase detection and correction circuit 314 prevents the delay-locked loop 300 from generating an output signal that is 180 degrees out of phase with the CLK signal, which can occur when the total delay introduced by the delay-locked loop equals one-half the period TCK of the CLK signal, as will be appreciated by those skilled in the art.

An output buffer 316 generates a synchronized clock signal CLKSYNC signal in response to the CDVCLK signal, the CLKSYNC being synchronized with the CLK signal. The output buffer 316 introduces an output buffer delay DOB, causing the CLKSYNC signal to be delayed by this amount relative to the CDVCLK signal. The output buffer delay DOB, along with delays introduced by the clock divider 312 and phase detection and correction circuit 314, form the D2 component of the model delay D1+D2 generated by the feedback delay line 306. As illustrated by a dotted line in FIG. 3, the output buffer 316 may correspond to a data driver that receives a data signal DQX and outputs the data signal in response to being clocked by the CDVCLK signal, as will be appreciated by those skilled in the art. One skilled in the art will understand various circuits that may be utilized to form the components 302–316 of the delay-locked loop 300.

Figure 4:
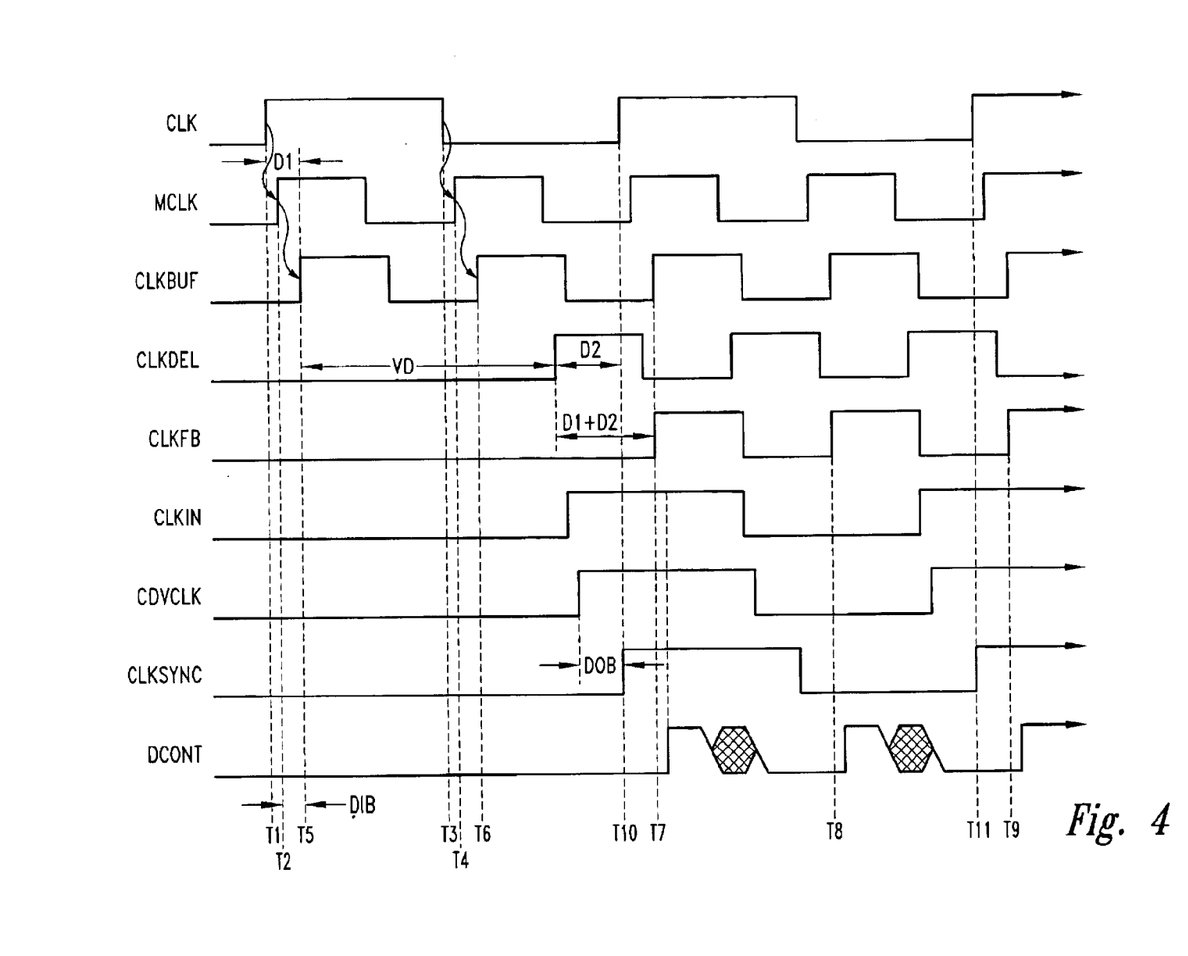
FIG. 4 is a signal timing diagram illustrating various signals generated during operation of the delay-locked loop of FIG. 3.

The operation of the delay-locked loop 300 will now be briefly described with reference to the signal timing diagram of FIG. 4 that illustrates various signals generated in the delay-locked loop during operation. The detailed operation of the delay-locked locked loop 300 is similar to that previously described for the delay-locked loop 100 of FIG. 1, and thus, for the sake of brevity, a detailed description will not again be provided. In the delay-locked loop 300, the MCLK, CLKBUF, CLKDEL, and CLKFB signals are all twice the frequency of the CLK signal. Note that each rising-edge and falling-edge transition of the CLK signal generates a corresponding rising-edge of the MCLK signal, as shown at times T1, T2 and at times T3, T4, and that each rising-edge of the MCLK signal generates a corresponding rising-edge of the CLKBUF signal, as shown at times T5, T6. As previously described, the phase detector 308 (FIG. 3) compares each rising-edge of the CLKBUF signal to a corresponding rising-edge of the CLKFB signal, as illustrated at times T7, T8, and T9. Because the frequency of the CLKBUF and CLKFB signals is twice the frequency of the CLK signal, these comparisons occur twice during each period of the CLK signal. For example, for the period TCK of the CLK signal extending from a time T10 to a time T11, the phase detector 308 asserts the delay control signal DCONT signal twice at the times T7 and the T8.

The delay-locked loop 300 adjusts the delay of the CLKDEL signal in response to both rising- and falling-edges of the CLK signal, enabling the delay-locked to more quickly lock the CLK and CLKSYNC signals. This is true because the delay-locked loop 300 adjusts the phase of CLKDEL signal more frequently (twice per period TCK of the CLK signal) to thereby lock the CLK and CLKSYNC signals. Moreover, since the frequency of the CLKBUF, CLKDEL, and CLKFB signals is twice the frequency FCLK of the CLK signal, the variable delay line 304 (FIG. 3) may be smaller than a conventional variable delay line. The maximum variable delay VD the variable delay line 304 must provide is given by N×TCK−(D1+D2) for the maximum period TCK of the CLK signal to be locked, and in the delay-locked loop 300 the maximum period TCK is one-half the maximum period of the corresponding CLK signal due to the frequency of the CLKBUF, CLKDEL, and CLKFB signals being doubled.

Figure 5:
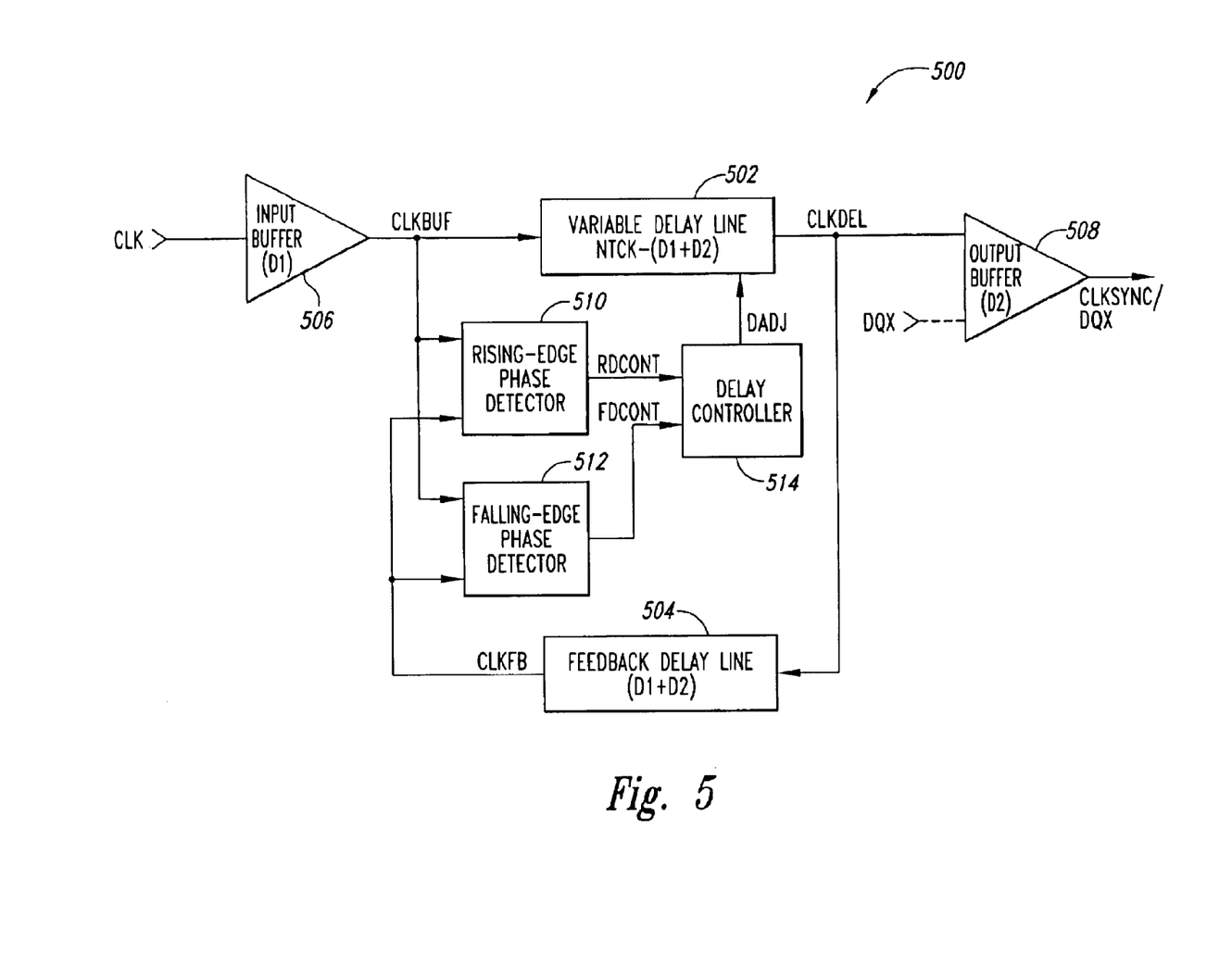
FIG. 5 is a functional block diagram illustrating a delay-locked loop according to another embodiment of the present invention.

FIG. 5 is a functional block diagram of a delay-locked loop 500 that adjusts a delay of a synchronized clock signal CLKSYNC relative to an applied clock signal CLK in response to both rising- and falling-edges of the applied clock signal according to another embodiment of the present invention. The delay-locked loop 500 includes a variable delay line 502, a feedback delay line 504, an input buffer 506, and an output buffer 508, all of which operate as previously described for the corresponding components in the delay-locked loop 300 of FIG. 3, and thus, for the sake of brevity, the operation of these components will not again be described in detail. The delay-locked loop 500 further includes a rising-edge phase detector 510 that receives the CLKFB and CLKBUF signals and generates a rising-edge delay control signal RDCONT having a value indicating the phase difference between rising-edges of the CLKBUF and CLKFB signals. A falling-edge phase detector 512 receives the CLKFB and CLKBUF signals and generates a falling-edge delay control signal FDCONT having a value indicating the phase difference between falling-edges of the CLKFB and CLKBUF signals. A delay controller 514 generates a delay adjustment signal DADJ in response to the RDCONT and FDCONT signals from the phase detectors 510, 512, and applies the DADJ signal to the variable delay line 102 to adjust the variable delay VD. The phase detectors 510, 512 and delay controller 514 operate in combination to adjust the variable delay VD of the variable delay line 502 as a function of the detected phase between rising-edges and falling-edges of the CLKBUF and CLKFB signals.

In operation, the phase detector 510 detects the phase difference between rising-edges of the CLKBUF and CLKFB signals and applies the corresponding RDCONT signal to the delay controller 514 which, in turn, generates the DADJ signal to adjust the variable delay VD of the CLKDEL signal. The phase detector 512 operates in the same way to detect the phase difference between falling-edges of the CLKBUF and CLKFB signals and applied the corresponding FDCONT signal to the delay controller 514 which, in turn, generates the DADJ signal to adjust the variable delay VD of the CLKDEL signal. The phase detectors 510, 512 and delay controller 514 operate in combination to adjust the delay of the CLKDEL signal until the phase difference between the CLKBUF and CLKFB signals is approximately zero.

Figure 6:
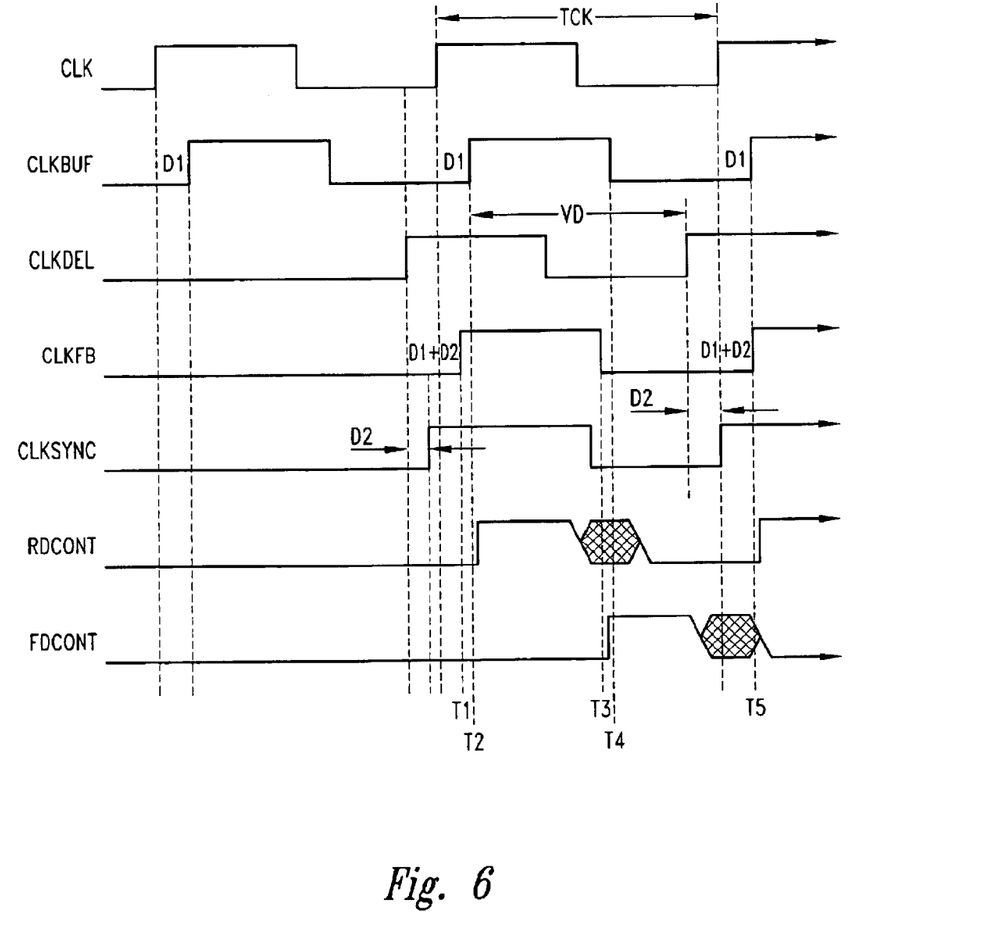
FIG. 6 is a signal timing diagram illustrating various signals generated during operation of the delay-locked loop of FIG. 5.

The operation of the delay-locked loop 500 will now be briefly described with reference to the signal timing diagram of FIG. 6, which illustrates various signals generated in the delay-locked loop during operation. The detailed operation of the delay-locked loop 500 is similar to that previously described for the delay-locked loop 300 of FIG. 3, and thus, for the sake of brevity, a detailed description will not again be provided. In the delay-locked loop 500, the rising-edge phase detector 510 compares rising-edges of the CLKFB and CLKBUF signals at times T1 and T2, and generates the RDCONT signal at just after the time T2 to adjust the variable delay VD of the CLKDEL signal in response to the detected phase difference. Similarly, at times T3 and T4, the falling-edge phase detector 512 compares falling-edges of the CLKFB and CLKBUF signals, and generates the FDCONT signal at just after the time T4 to adjust the variable delay VD of the CLKDEL signal in response to the detected phase difference. Thus, the delay-locked loop 500 adjusts the variable delay VD of the variable delay line 502 (FIG. 5) twice during each period TCK of the CLK signal, once in response to the rising-edge of the CLK signal and once in response to the falling-edge of the CLK signal. In this way, the delay-locked loop 500 more quickly synchronizes the CLK and CLKSYNC signals, reducing the number of cycles of the CLK signal required for the delay-locked loop to lock.

Figure 7:
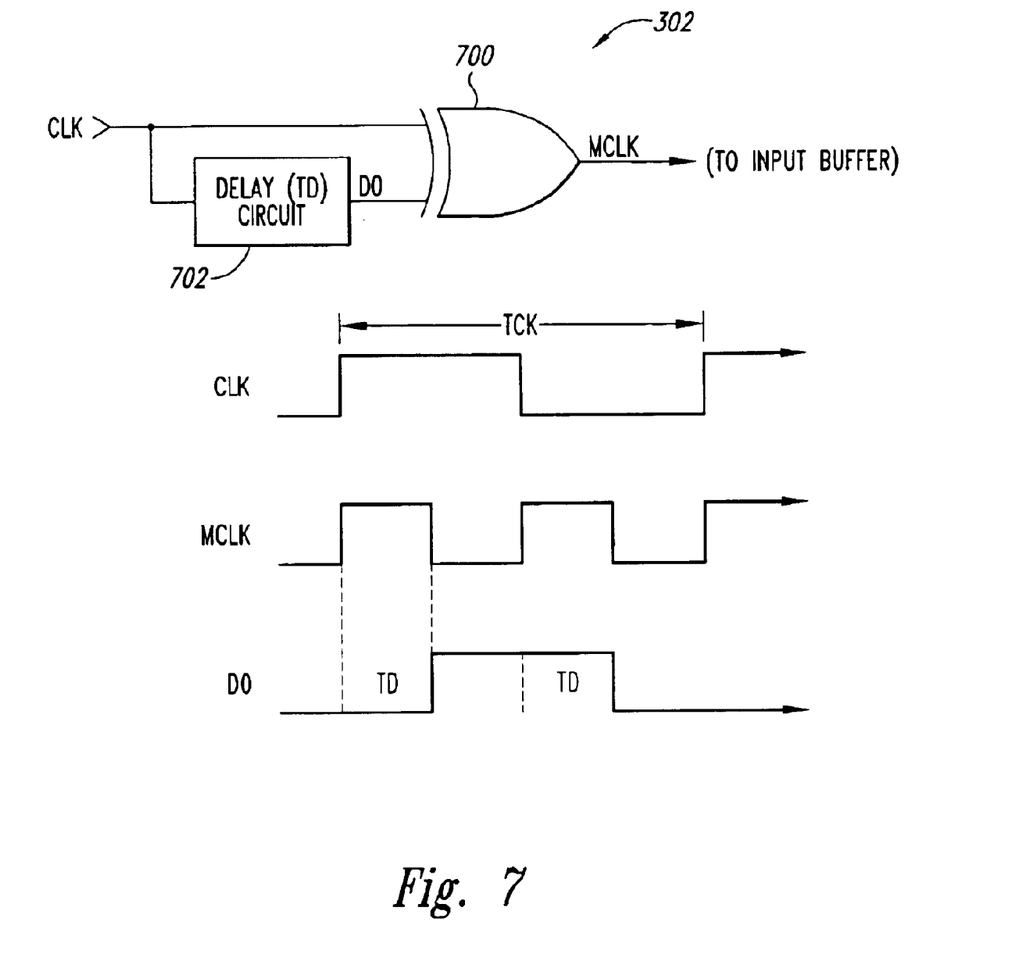
FIG. 7 is a diagram illustrating one embodiment of the clock multiplier of FIG. 3 and various signals generated during operation of the clock multiplier.

FIG. 7 is a diagram illustrating one embodiment of the clock multiplier 302 of FIG. 3 and various signals generated during operation of the clock multiplier. An XOR gate 700 receives the CLK signal on a first input, and a delay circuit 702 receives the CLK signal and applies a delayed signal DO to a second input of the XOR gate in response to the CLK signal. As the timing diagram of FIG. 7 illustrates, the delay circuit 702 generates the delayed signal DO having a delay TD relative to the either a rising- or falling-edge of the CLK signal. In operation, when the CLK transitions high or low, the XOR gate 700 receives the high or low CLK signal on one input and the complement of the CLK signal on the other input for the delay TD. In response to these signals, the XOR gate 700 drives the MCLK signal high for the delay TD, at which point both inputs of the XOR gate 700 receive either high or low signals, causing the XOR gate to drive the MCLK signal low.

Figure 8:
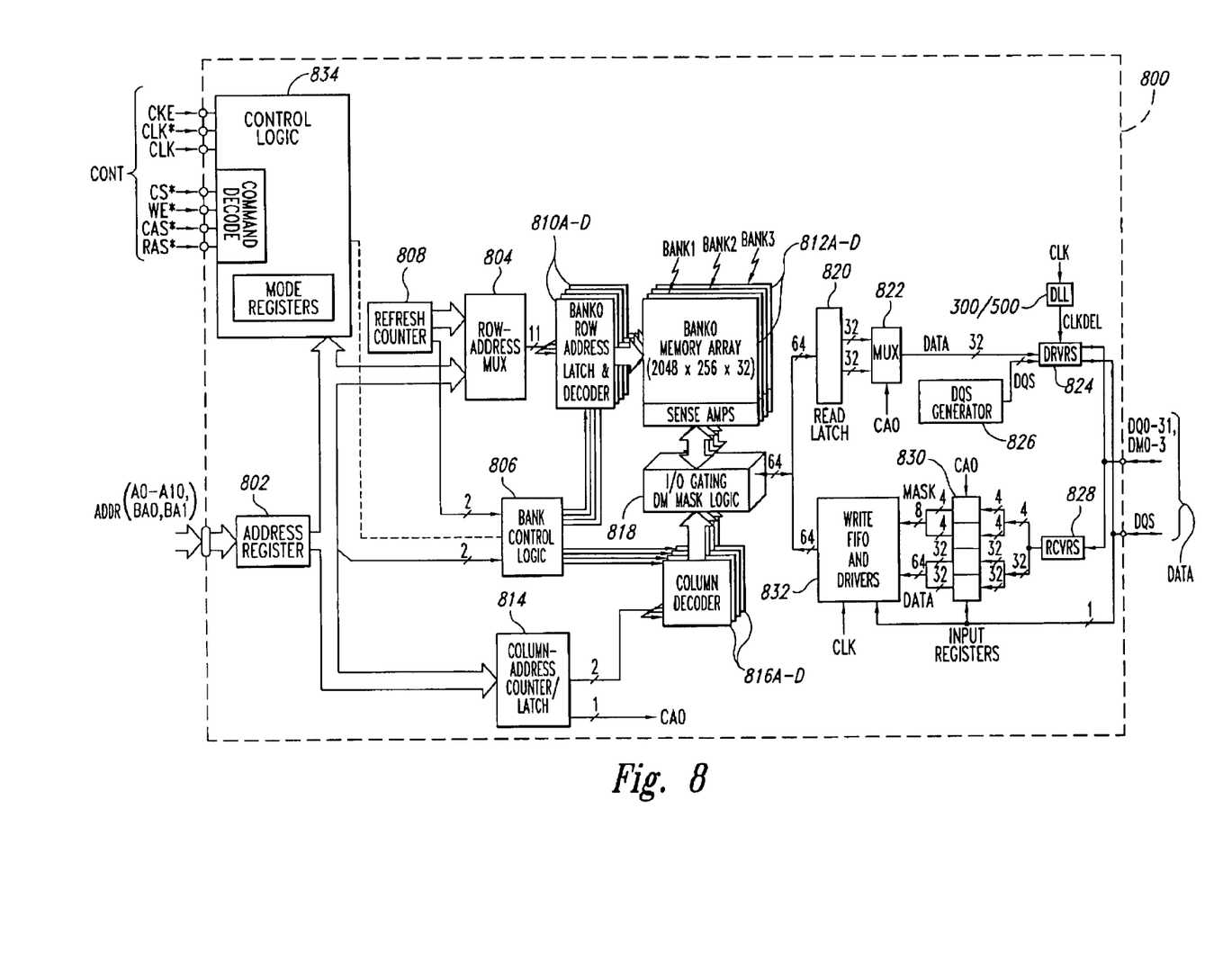
FIG. 8 is a functional block diagram illustrating a synchronous memory device including the delay-locked loop of FIG. 3 and/or the delay-locked loop of FIG. 5.

FIG. 8 is a functional block diagram of a memory device 800 including the delay-locked loop 300 of FIG. 3 and/or the delay-locked loop 500 of FIG. 5. The memory device 800 in FIG. 8 is a double-data rate (DDR) synchronous dynamic random access memory ("SDRAM"), although the principles described herein are applicable to any memory device that may include a delay-locked loop for synchronizing internal and external signals, such as conventional synchronous DRAMs (SDRAMs), as well as packetized memory devices like SLDRAMs and RDRAMs, and are equally applicable to any integrated circuit that must synchronize internal and external clocking signals.

The memory device 800 includes an address register 802 that receives row, column, and bank addresses over an address bus ADDR, with a memory controller (not shown) typically supplying the addresses. The address register 802 receives a row address and a bank address that are applied to a row address multiplexer 804 and bank control logic circuit 806, respectively. The row address multiplexer 804 applies either the row address received from the address register 802 or a refresh row address from a refresh counter 808 to a plurality of row address latch and decoders 810A–D. The bank control logic 806 activates the row address latch and decoder 810A–D corresponding to either the bank address received from the address register 802 or a refresh bank address from the refresh counter 808, and the activated row address latch and decoder latches and decodes the received row address. In response to the decoded row address, the activated row address latch and decoder 810A–D applies various signals to a corresponding memory bank 812A–D to thereby activate a row of memory cells corresponding to the decoded row address. Each memory bank 812A–D includes a memory-cell array having a plurality of memory cells arranged in rows and columns, and the data stored in the memory cells in the activated row is stored in sense amplifiers in the corresponding memory bank. The row address multiplexer 804 applies the refresh row address from the refresh counter 808 to the decoders 810A–D and the bank control logic circuit 806 uses the refresh bank address from the refresh counter when the memory device 800 operates in an auto-refresh or self-refresh mode of operation in response to an auto- or self-refresh command being applied to the memory device 800, as will be appreciated by those skilled in the art.

A column address is applied on the ADDR bus after the row and bank addresses, and the address register 802 applies the column address to a column address counter and latch 814 which, in turn, latches the column address and applies the latched column address to a plurality of column decoders 816A–D. The bank control logic 806 activates the column decoder 816A–D corresponding to the received bank address, and the activated column decoder decodes the applied column address. Depending on the operating mode of the memory device 800, the column address counter and latch 814 either directly applies the latched column address to the decoders 816A–D, or applies a sequence of column addresses to the decoders starting at the column address provided by the address register 802. In response to the column address from the counter and latch 814, the activated column decoder 816A–D applies decode and control signals to an I/O gating and data masking circuit 818 which, in turn, accesses memory cells corresponding to the decoded column address in the activated row of memory cells in the memory bank 812A–D being accessed.

During data read operations, data being read from the addressed memory cells is coupled through the I/O gating and data masking circuit 818 to a read latch 820. The I/O gating and data masking circuit 818 supplies N bits of data to the read latch 820, which then applies two N/2 bit words to a multiplexer 822. In the embodiment of FIG. 3, the circuit 818 provides 64 bits to the read latch 820 which, in turn, provides two 32 bits words to the multiplexer 822. A data driver 824 sequentially receives the N/2 bit words from the multiplexer 822 and also receives a data strobe signal DQS from a strobe signal generator 826 and a delayed clock signal CLKDEL from the delay-locked loop 300/500. The DQS signal is used by an external circuit such as a memory controller (not shown) in latching data from the memory device 800 during read operations. In response to the delayed clock signal CLKDEL, the data driver 824 sequentially outputs the received N/2 bits words as a corresponding data word DQ, each data word being output in synchronism with a rising or falling edge of a CLK signal that is applied to clock the memory device 800. The data driver 824 also outputs the data strobe signal DQS having rising and falling edges in synchronism with rising and falling edges of the CLK signal, respectively. Each data word DQ and the data strobe signal DQS collectively define a data bus DATA. As will be appreciated by those skilled in the art, the CLKDEL signal from the DLL is a delayed version of the CLK signal, and the delay-locked loop 300/500 adjusts the delay of the CLKDEL signal relative to the CLK signal to ensure that the DQS signal and the DQ words are placed on the DATA bus in synchronism with the CLK signal, as previously described with reference to FIGS. 3–6. The DATA bus also includes masking signals DM0-M, which will be described in more detail below with reference to data write operations.

During data write operations, an external circuit such as a memory controller (not shown) applies N/2 bit data words DQ, the strobe signal DQS, and corresponding data masking signals DM0-X on the data bus DATA. A data receiver 828 receives each DQ word and the associated DM0-X signals, and applies these signals to input registers 830 that are clocked by the DQS signal. In response to a rising edge of the DQS signal, the input registers 830 latch a first N/2 bit DQ word and the associated DM0-X signals, and in response to a falling edge of the DQS signal the input registers latch the second N/2 bit DQ word and associated DM0-X signals. The input register 830 provides the two latched N/2 bit DQ words as an N-bit word to a write FIFO and driver 832, which clocks the applied DQ word and DM0-X signals into the write FIFO and driver in response to the DQS signal. The DQ word is clocked out of the write FIFO and driver 832 in response to the CLK signal, and is applied to the I/O gating and masking circuit 818. The I/O gating and masking circuit 818 transfers the DQ word to the addressed memory cells in the accessed bank 812A–D subject to the DM0-X signals, which may be used to selectively mask bits or groups of bits in the DQ words (i.e., in the write data) being written to the addressed memory cells.

A control logic and command decoder 834 receives a plurality of command and clocking signals over a control bus CONT, typically from an external circuit such as a memory controller (not shown). The command signals include a chip select signal CS*, a write enable signal WE*, a column address strobe signal CAS*, and a row address strobe signal RAS*, while the clocking signals include a clock enable signal CKE* and complementary clock signals CLK, CLK*, with the "*" designating a signal as being active low. The command signals CS*, WE*, CAS*, and RAS* are driven to values corresponding to a particular command, such as a read, write, or auto-refresh command. In response to the clock signals CLK, CLK*, the command decoder 834 latches and decodes an applied command, and generates a sequence of clocking and control signals that control the components 802–832 to execute the function of the applied command. The clock enable signal CKE enables clocking of the command decoder 834 by the clock signals CLK, CLK*. The command decoder 834 latches command and address signals at positive edges of the CLK, CLK* signals (i.e., the crossing point of CLK going high and CLK* going low), while the input registers 830 and data drivers 824 transfer data into and from, respectively, the memory device 800 in response to both edges of the data strobe signal DQS and thus at double the frequency of the clock signals CLK, CLK*. This is true because the DQS signal has the same frequency as the CLK, CLK* signals. The memory device 800 is referred to as a double-data-rate device because the data words DQ being transferred to and from the device are transferred at double the rate of a conventional SDRAM, which transfers data at a rate corresponding to the frequency of the applied clock signal. The detailed operation of the control logic and command decoder 834 in generating the control and timing signals is conventional, and thus, for the sake of brevity, will not be described in more detail.

Figure 9:
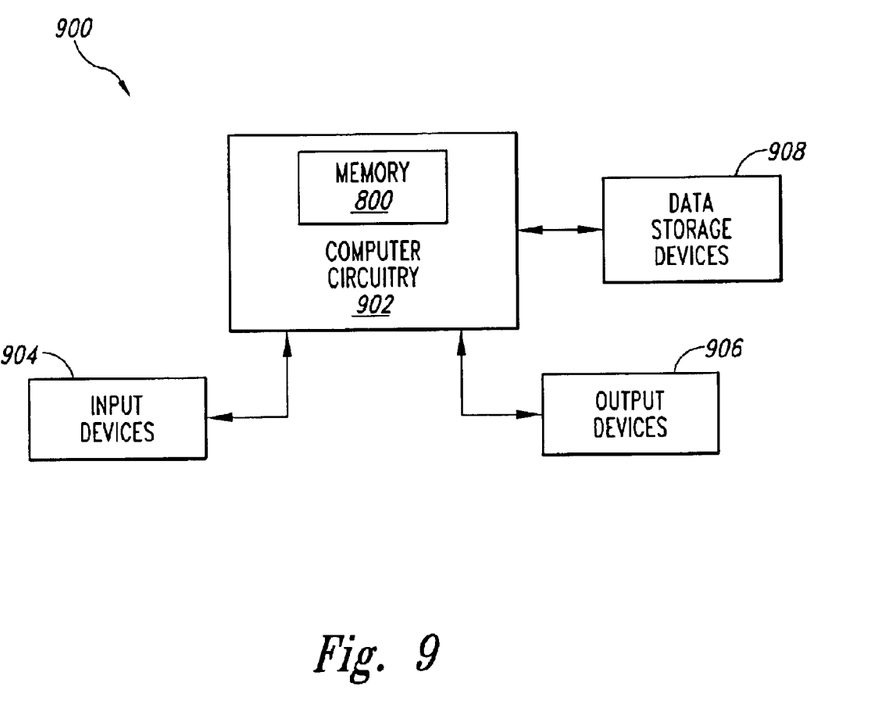
FIG. 9 is a functional block diagram illustrating a computer system including a synchronous memory device of FIG. 8.

FIG. 9 is a block diagram of a computer system 900 including computer circuitry 902 including the memory device 800 of FIG. 8. Typically, the computer circuitry 902 is coupled through address, data, and control buses to the memory device 800 to provide for writing data to and reading data from the memory device. The computer circuitry 902 includes circuitry for performing various computing functions, such as executing specific software to perform specific calculations or tasks. In addition, the computer system 900 includes one or more input devices 904, such as a keyboard or a mouse, coupled to the computer circuitry 902 to allow an operator to interface with the computer system. Typically, the computer system 900 also includes one or more output devices 906 coupled to the computer circuitry 902, such as output devices typically including a printer and a video terminal. One or more data storage devices 908 are also typically coupled to the computer circuitry 902 to store data or retrieve data from external storage media (not shown). Examples of typical storage devices 908 include hard and floppy disks, tape cassettes, compact disk read-only (CD-ROMs) and compact disk read-write (CD-RW) memories, and digital video disks (DVDs).

It is to be understood that even though various embodiments and advantages of the present invention have been set forth in the foregoing description, the above disclosure is illustrative only, and changes may be made in detail, and yet remain within the broad principles of the invention. For example, many of the components described above may be implemented using either digital or analog circuitry, or a combination of both, and also, where appropriate, may be realized through software executing on suitable processing circuitry. Therefore, the present invention is to be limited only by the appended claims.

What is claimed is:

1. A delay-locked loop, comprising:
    a variable delay circuit for receiving an input clock signal and operable to generate a delayed clock signal responsive to the input clock signal, the delayed clock signal having a delay relative to the input clock signal and the variable delay circuit controlling the value of the delay responsive to a delay control signal;
    a fixed delay line that generates a feedback clock signal in response to the delayed clock signal, the feedback clock signal having a fixed delay relative to the delayed clock signal;
    a rising-edge phase detector coupled to receive the feedback clock signal and the input clock signal, and operable to generate a rising-edge delay control signal responsive to a detected phase between rising-edges of the feedback and input clock signals;
    a falling-edge phase detector coupled to receive the feedback clock signal and the input clock signal, and operable to generate a falling-edge delay control signal responsive to a detected phase between falling-edges of the feedback and input clock signals; and
    a delay controller coupled to the phase detectors and operable to develop the delay control signal responsive to the rising- and falling-edge delay control signals.

2. The delay-locked loop of claim 1 wherein the fixed delay comprises a first delay and a second delay, the first delay including an input buffer, and the second delay including a delay of an output circuit that provides a synchronized clock signal responsive to the delayed clock signal, the synchronized clock signal being synchronized with the input clock signal.

3. The delay-locked loop of claim 2 wherein the output circuit comprises a data output buffer.

4. A delay-locked loop, comprising:
    a variable delay circuit for receiving an input clock signal and operable to generate a delayed clock signal responsive to the input clock signal, the delayed clock signal having a delay relative to the input clock signal and the variable delay circuit operable to control the value of the delay responsive to a delay control signal; and
    a feedback delay circuit coupled to the variable delay circuit, the feedback delay circuit generating a feedback clock signal responsive to the delayed clock signal, the feedback clock signal having a model delay relative to the delayed clock signal;
    a rising-edge phase detector for receiving the input clock signal and coupled to the variable delay circuit to receive the delayed clock signal, the rising-edge phase detector generating the delay control signal in response to the relative phases of rising-edges of the delayed clock signal and the input clock signal; and
    a falling-edge phase detector for receiving the input clock signal and coupled to the variable delay circuit to receive the delayed clock signal, the falling-edge phase detector generating the delay control signal in response to the relative phases of falling-edges of the delayed clock signal and the input clock signal.

5. The delay-locked loop of claim 4 wherein the model delay of the feedback clock signal corresponds to a first delay component corresponding to an input buffer for receiving an external clock signal and to develop the input clock signal to the variable delay circuit in response to the external clock signal, and a second delay component corresponding to an output buffer that receives the delayed clock signal and generates a synchronized clock signal in response the delayed clock signal, the synchronized clock signal being synchronized with the external clock signal when the delay-locked loop is locked.

6. A delay-locked loop, comprising
    an input buffer circuit for receiving an input clock signal and operable to generate a buffered clock in response to the input clock signal;
    a variable delay line coupled to the input buffer and operable to generate a delayed clock signal responsive to the buffered clock signal, the delayed clock signal having a delay relative to the buffered clock signal and the variable delay line operable to control the value of the delay responsive to a delay control signal;

a feedback delay line coupled to the variable delay line, the feedback delay line generating a feedback clock signal responsive to the delayed clock signal, the feedback clock signal having a model delay relative to the delayed clock signal;

a rising-edge phase detector coupled to the input buffer to receive the buffered clock signal and coupled to the variable delay line to receive the delayed clock signal, the rising-edge phase detector generating the delay control signal in response to the relative phases of rising-edges of the delayed clock signal and the buffered clock signal;

a falling-edge phase detector for receiving the input clock signal and coupled to the variable delay line to receive the delayed clock signal, the falling-edge phase detector generating the delay control signal in response to the relative phases of falling-edges of the delayed clock signal and the buffered clock signal;

an output buffer coupled to the variable delay line to receive the delayed clock signal, the output buffer circuit generating a synchronized clock signal in response to the delayed clock signal.

7. The delay-locked loop of claim 6 wherein the model delay of the feedback delay line comprises a first delay corresponding to delay of the input buffer, and a second component corresponding to a delay of the output buffer.

8. The delay-locked loop of claim 6 wherein the output buffer receives a data signal and provides the data signal on an output as the synchronized clock signal in response to the delayed clock signal.

9. A memory device, comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit;
a delay-locked loop coupled to at least the control circuit and for receiving an input clock signal, the delay-locked loop operable to generate a delayed clock signal and the control circuit generating control signals in response to the delayed clock signal, the delay-locked loop comprising,
  a variable delay circuit coupled to the input clock signal and operable to generate the delayed clock signal responsive to the input clock signal, the delayed clock signal having a delay relative to the input clock signal and the variable delay circuit controlling the value of the delay responsive to a delay control signal;
  a fixed delay line that generates a feedback clock signal in response to the delayed clock signal, the feedback clock signal having a fixed delay relative to the delayed clock signal:
  a rising-edge phase detector coupled to receive the feedback clock signal and the input clock signal, and operable to generate a rising-edge delay control signal responsive to a detected phase between rising-edges of the feedback and input clock signals;
  a falling-edge phase detector coupled to receive the feedback clock signal and the input clock signal, and operable to generate a falling-edge delay control signal responsive to a detected phase between falling-edges of the feedback and input clock signals; and
  a delay controller coupled to the phase detectors and operable to develop the delay control signal responsive to the rising- and falling-edge delay control signals.

10. The memory device of claim 9 wherein the memory device comprises a DDR SDRAM and the delayed clock signal is applied to clock an output driver coupled to the data bus.

11. A computer system, comprising:
a data input device;
a data output device;
a processor coupled to the data input and output devices; and
a memory device coupled to the processor, the memory device comprising,
  an address bus;
  a control bus;
  a data bus;
  an address decoder coupled to the address bus;
  a read/write circuit coupled to the data bus;
  a control circuit coupled to the control bus;
  a memory-cell array coupled to the address decoder, control circuit, and read/write circuit;
  a delay-locked loop coupled to at least the control circuit and for receiving an input clock signal, the delay-locked loop operable to generate a delayed clock signal and the control circuit generating control signals in response to the delayed clock signal, the delay-locked loop comprising,
    a variable delay circuit coupled to the input clock signal and operable to generate the delayed clock signal responsive to the input clock signal, the delayed clock signal having a delay relative to the input clock signal and the variable delay circuit controlling the value of the delay responsive to a delay control signal;
    a fixed delay line that generates a feedback clock signal in response to the delayed clock signal, the feedback clock signal having a fixed delay relative to the delayed clock signal;
    a rising-edge phase detector coupled to receive the feedback clock signal and the input clock signal, and operable to generate a rising-edge delay control signal responsive to a detected phase between rising-edges of the feedback and input clock signals;
    a falling-edge phase detector coupled to receive the feedback clock signal and the input clock signal, and operable to generate a falling-edge delay control signal responsive to a detected phase between falling-edges of the feedback and input clock signals; and
    a delay controller coupled to the phase detectors and operable to develop the delay control signal responsive to the rising- and falling-edge delay control signals.

12. The memory device of claim 11 wherein the memory device comprises a DDR SDRAM and the delayed clock signal is applied to clock an output dryer coupled to the data bus.

13. A method for generating a delayed clock signal having a delay relative to an applied clock signal, the method comprising:

generating the delayed clock signal in response to the applied clock signal;

delaying the delayed clock signal relative to the applied clock signal;

delaying the delayed clock signal by a model delay to generate a feedback clock signal;

detecting a phase difference between rising edges of the feedback clock signal and rising-edges of the applied clock signal;

detecting a phase difference between falling edges of the feedback clock signal and falling edges of the applied clock signal; and adjusting the delay of the delayed clock signal responsive to the detected phase differences.

14. The method of claim 13 further comprising clocking data in response to the delayed clock signal.

15. The memory device of claim 9 wherein the fixed delay of the delay-locked loop comprises a first delay and a second delay, the first delay including an input buffer, and the second delay including a delay of an output circuit that provides a synchronized clock signal responsive to the delayed clock signal, the synchronized clock signal being synchronized with the input clock signal.

16. The delay-locked loop of claim 15 wherein the output circuit comprises a data output buffer.

17. The computer system of claim 11 wherein the fixed delay of the delay-locked loop comprises a first delay and a second delay, the first delay including an input buffer, and the second delay including a delay of an output circuit that provides a synchronized clock signal responsive to the delayed clock signal, the synchronized clock signal being synchronized with the input clock signal.

18. The delay-locked loop of claim 17 wherein the output circuit comprises a data output buffer.

* * * * *